United States Patent
Kuan

(10) Patent No.: US 9,299,870 B2
(45) Date of Patent: Mar. 29, 2016

(54) SOLAR DEVICE AND FRAME ASSEMBLY THEREOF

(71) Applicant: AU Optronics Corp., Hsin-Chu (TW)

(72) Inventor: Hao-Hung Kuan, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 340 days.

(21) Appl. No.: 13/862,477

(22) Filed: Apr. 15, 2013

(65) Prior Publication Data

US 2014/0048498 A1   Feb. 20, 2014

(30) Foreign Application Priority Data

Aug. 14, 2012   (CN) .......................... 2012 1 0288181

(51) Int. Cl.
| | |
|---|---|
| A47G 19/08 | (2006.01) |
| H01L 31/048 | (2014.01) |
| F24J 2/52 | (2006.01) |
| H02S 30/10 | (2014.01) |
| H02S 40/32 | (2014.01) |
| H02S 40/34 | (2014.01) |
| F24J 2/46 | (2006.01) |

(52) U.S. Cl.
CPC ............. *H01L 31/048* (2013.01); *F24J 2/5211* (2013.01); *F24J 2/5243* (2013.01); *H02S 30/10* (2014.12); *H02S 40/32* (2014.12); *H02S 40/34* (2014.12); *F24J 2002/4661* (2013.01)

(58) Field of Classification Search
CPC ....... F24J 2/5262; F24J 2/5211; F24J 2/5245; F24J 2/5247; F24J 2/5264; F24J 2002/5292; F24J 2/5243; F24J 2002/4661; H01L 31/0482; H01L 31/0484; H01L 31/048; Y02B 10/12; Y02E 10/47; H02S 30/10; H02S 40/32; H02S 40/34
USPC ........................................................ 211/41.1
See application file for complete search history.

(56) References Cited

U.S. PATENT DOCUMENTS

| | | | | | |
|---|---|---|---|---|---|
| 3,094,305 | A | * | 6/1963 | Lohrman | 248/223.41 |
| 3,640,497 | A | * | 2/1972 | Waki | 248/220.41 |
| 4,826,022 | A | * | 5/1989 | Duarte | 211/59.1 |
| 5,228,579 | A | * | 7/1993 | Kaufman | 211/94.01 |
| 5,725,107 | A | * | 3/1998 | Dembicks | 211/70.6 |
| 5,775,521 | A | * | 7/1998 | Tisbo | 211/94.01 |
| 7,086,542 | B2 | * | 8/2006 | Tomonari et al. | 211/94.01 |
| 8,267,363 | B2 | * | 9/2012 | Begic et al. | 248/221.11 |
| 8,662,462 | B2 | * | 3/2014 | Sun | 248/231.9 |
| 9,010,033 | B2 | * | 4/2015 | Woods et al. | 52/36.5 |
| 2008/0283118 | A1 | | 11/2008 | Rotzoll | |
| 2011/0000526 | A1 | * | 1/2011 | West | 136/251 |
| 2011/0070765 | A1 | | 3/2011 | Kobayashi | |

FOREIGN PATENT DOCUMENTS

| | | |
|---|---|---|
| CN | 201838606 U | 5/2011 |
| TW | M368789 | 11/2009 |
| TW | M417526 | 12/2011 |

* cited by examiner

*Primary Examiner* — Korie H Chan
(74) *Attorney, Agent, or Firm* — Winston Hsu; Scott Margo

(57) ABSTRACT

A frame assembly including a frame and a bracket is disclosed. The frame has a sliding groove and a first engaging groove, wherein the sliding groove is formed at one side of the frame and the first engaging groove is formed in the sliding groove. The bracket has a body and a first engaging part, wherein the first engaging part is extended from the body. When the body is disposed in the sliding groove, the first engaging part is engaged in the first engaging groove.

13 Claims, 12 Drawing Sheets

SOLAR DEVICE AND FRAME ASSEMBLY THEREOF

BACKGROUND OF THE INVENTION

1. Field of the Invention

The invention relates to a solar device and a frame assembly thereof and, more particularly, to a frame assembly consisting of frames and brackets and a solar device equipped with the frame assembly.

2. Description of the Prior Art

Referring to FIGS. 1 and 2, FIG. 1 is a rear view illustrating a solar device 1 of the prior art, and FIG. 2 is a cross-sectional view illustrating the solar device 1 along line X-X shown in FIG. 1. As shown in FIGS. 1 and 2, the solar device 1 comprises four frames 10, a solar panel 12 and an electronic component 16 (e.g. inverter). The four frames 10 are connected to each other so as to form a rectangular shape. The solar panel 12 is disposed in the frames 10. In practical applications, the solar panel 12 can be manufactured by packaging a solar cell between two substrates. Two adjacent sides of the electronic component 16 are fixed on two of the frames 10 respectively by four screws 18. In general, different manufacturers may provide different assembly tolerances for product design. Therefore, it is necessary to develop various frames 10 and electronic components 16 with different assembly tolerances so as to satisfy the requirement of each manufacturer. However, the aforesaid manner must delay production schedule. Furthermore, as shown in FIG. 2, the electronic component 16 is much closer to the solar panel 12 such that the electronic component 16 may rub against the solar panel 12 once the solar device 1 deforms due to external force.

SUMMARY OF THE INVENTION

Therefore, one of objectives of the invention is to provide a solar device and a frame assembly thereof so as to solve the aforesaid problems.

According to an embodiment of the invention, a frame assembly comprises a frame and a bracket. The frame has a sliding groove and a first engaging groove, wherein the sliding groove is formed at one side of the frame and the first engaging groove is formed in the sliding groove. The bracket has a body and a first engaging part, wherein the first engaging part is extended from the body. When the body is disposed in the sliding groove, the first engaging part is engaged in the first engaging groove.

According to another embodiment of the invention, a solar device comprises a frame assembly, a solar panel and an electronic component. The frame assembly comprises two frames and two brackets. The two frames are connected to each other and each of the frames has a sliding groove and a first engaging groove, wherein the sliding groove is formed at one side of the frame and the first engaging groove is formed in the sliding groove. Each of the brackets has a body, a first engaging part and an extending part, wherein the first engaging part and the extending part are extended from the body. When the body of each of the brackets is disposed in the sliding groove of one of the frames, the first engaging part is engaged in the first engaging groove and the extending part is exposed out of the frame. The solar panel is disposed in the frames. Two adjacent sides of the electronic component are fixed on the two extending parts of the two brackets respectively.

As mentioned in the above, since the first engaging part of the bracket is engaged in the first engaging groove of the frame after assembling the solar device, the invention can increase contact area between the bracket and the frame effectively so as to prevent the bracket from loosing or coming off the frame.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, the use of "comprising", "including", "having", "containing", or "involving" and variations thereof herein is meant to encompass the items listed thereafter and equivalents thereof as well as additional items. Accordingly, the drawings and descriptions will be regarded as illustrative in nature and not as restrictive.

Figure 3:
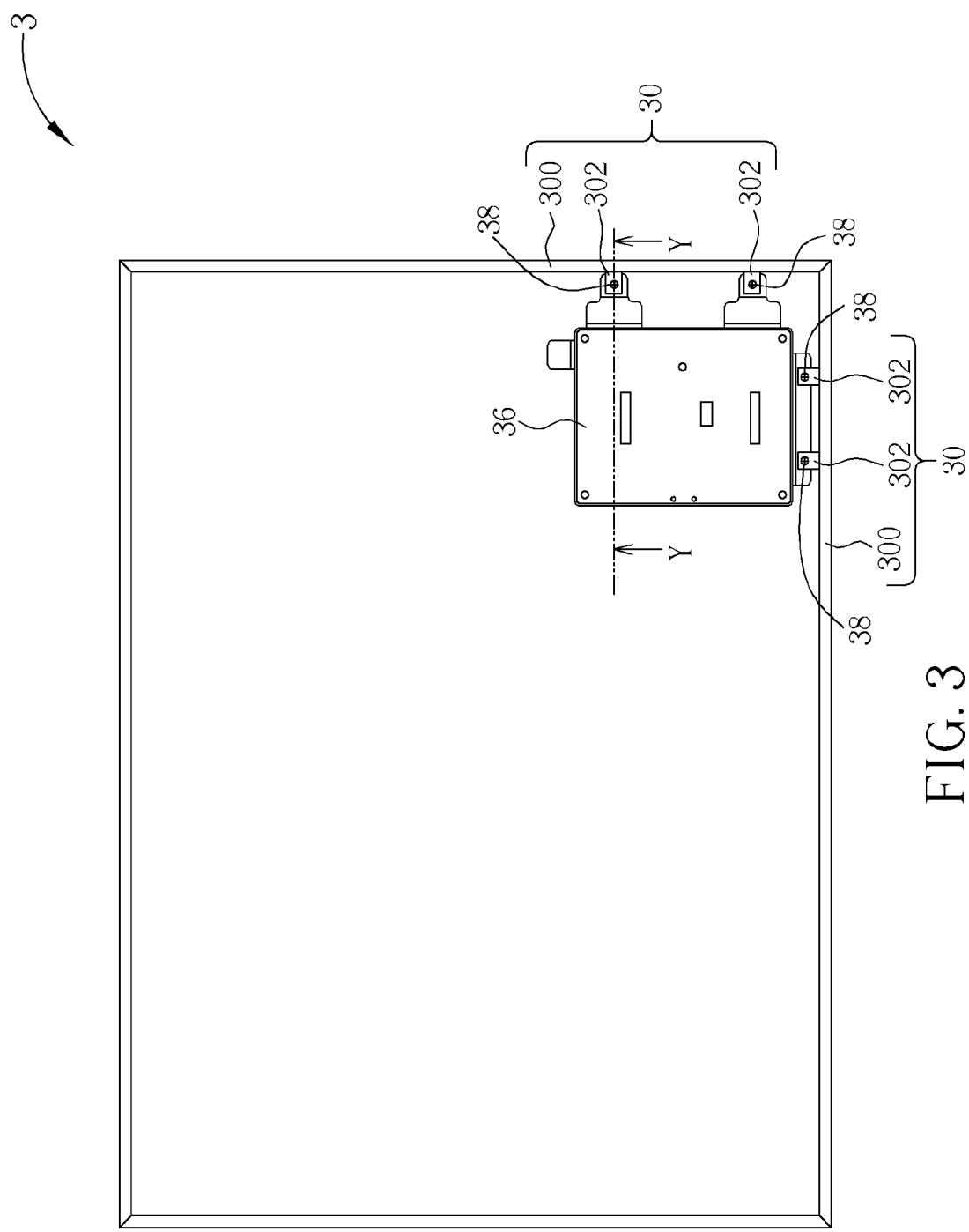
FIG. 3 is a rear view illustrating a solar device according to an embodiment of the invention.
Figure 4:
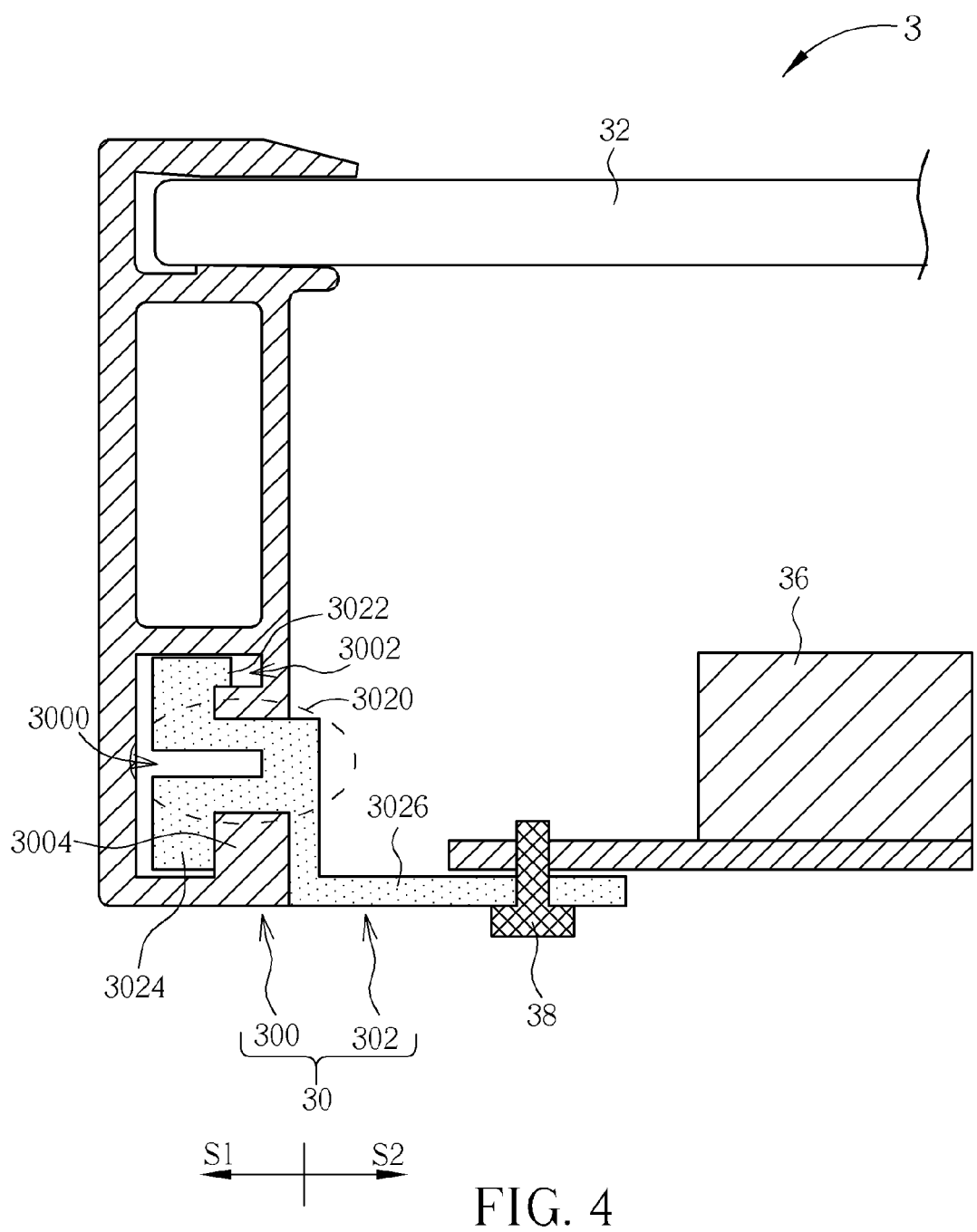
FIG. 4 is a cross-sectional view illustrating the solar device along line Y-Y shown in FIG. 3.
Figure 5:
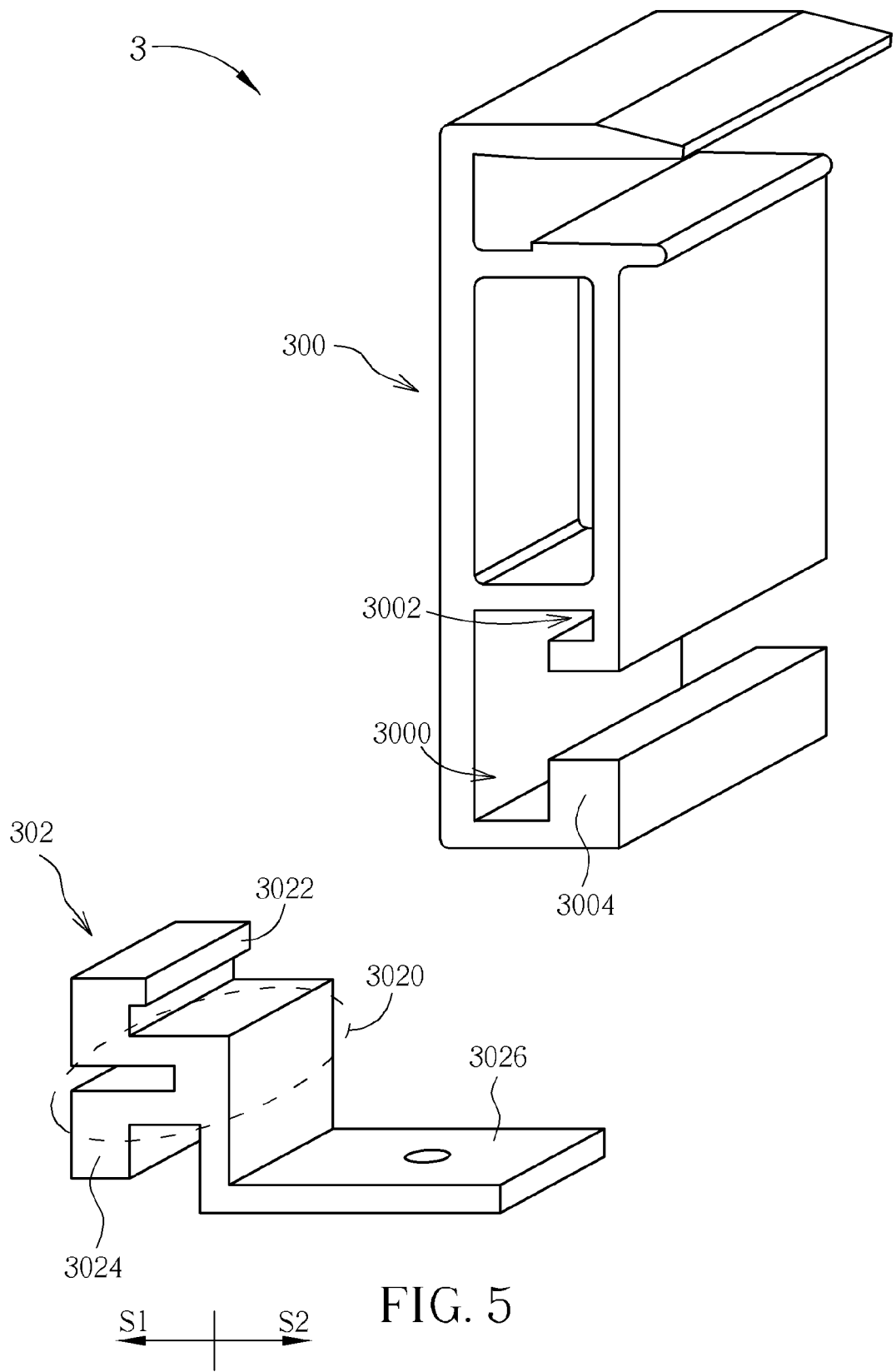
FIG. 5 is an exploded view illustrating the frame assembly shown in FIG. 4.

Referring to FIGS. 3 to 5, FIG. 3 is a rear view illustrating a solar device 3 according to an embodiment of the invention, FIG. 4 is a cross-sectional view illustrating the solar device 3 along line Y-Y shown in FIG. 3, and FIG. 5 is an exploded view illustrating the frame assembly 30 shown in FIG. 4. As shown in FIGS. 3 and 4, the solar device 3 comprises a frame assembly 30, a solar panel 32. The solar device 3 may further comprise an electronic component 36. In this embodiment, the frame assembly 30 comprises four frames 300 and four brackets 302. The four frames 300 are connected to each other and the four brackets 302 are disposed on two adjacent frames 300 respectively. Moreover, the number of brackets 302 can be determined based on practical applications. The solar panel 32 is disposed in the frames 300. In practical applications, the solar panel 32 can be manufactured by packaging a solar cell between two substrates.

As shown in FIGS. 4 and 5, the frame 300 has a sliding groove 3000, a first engaging groove 3002 and a first block part 3004, wherein the sliding groove 3000 is formed at one side of the frame 300, the first engaging groove 3002 is formed in the sliding groove 3000, and the first block part 3004 is formed in the sliding groove 3000. The first block part 3004 and the first engaging groove 3002 are located at opposite sides of the sliding groove 3000 respectively. The bracket 302 has a body 3020, a first engaging part 3022, a second block part 3024 and an extending part 3026, wherein the first engaging part 3022, the second block part 3024 and the extending part 3026 are extended from the body 3020. The second block part 3024 and the first engaging part 3022 are located at opposite sides of the body 3020 respectively.

In this embodiment, the first engaging part 3022 and the second block part 3024 are extended from a first side S1 of the body 3020 and the extending part 3026 is extended from a second side S2 of the body 3020, wherein the first side S1 and the second side S2 are opposite sides of the body 3020. Furthermore, the first engaging part 3022 is an inverse L-shape hook structure, the second block part 3024 is a pillar structure, and the extending part 3026 is a plate structure. When the body 3020 is disposed in the sliding groove 3000, the first engaging part 3022 is engaged in the first engaging groove 3002, the second block part 3024 abuts against the first block part 3004, and the extending part 3026 is exposed out of the frame 300.

Figure 1:
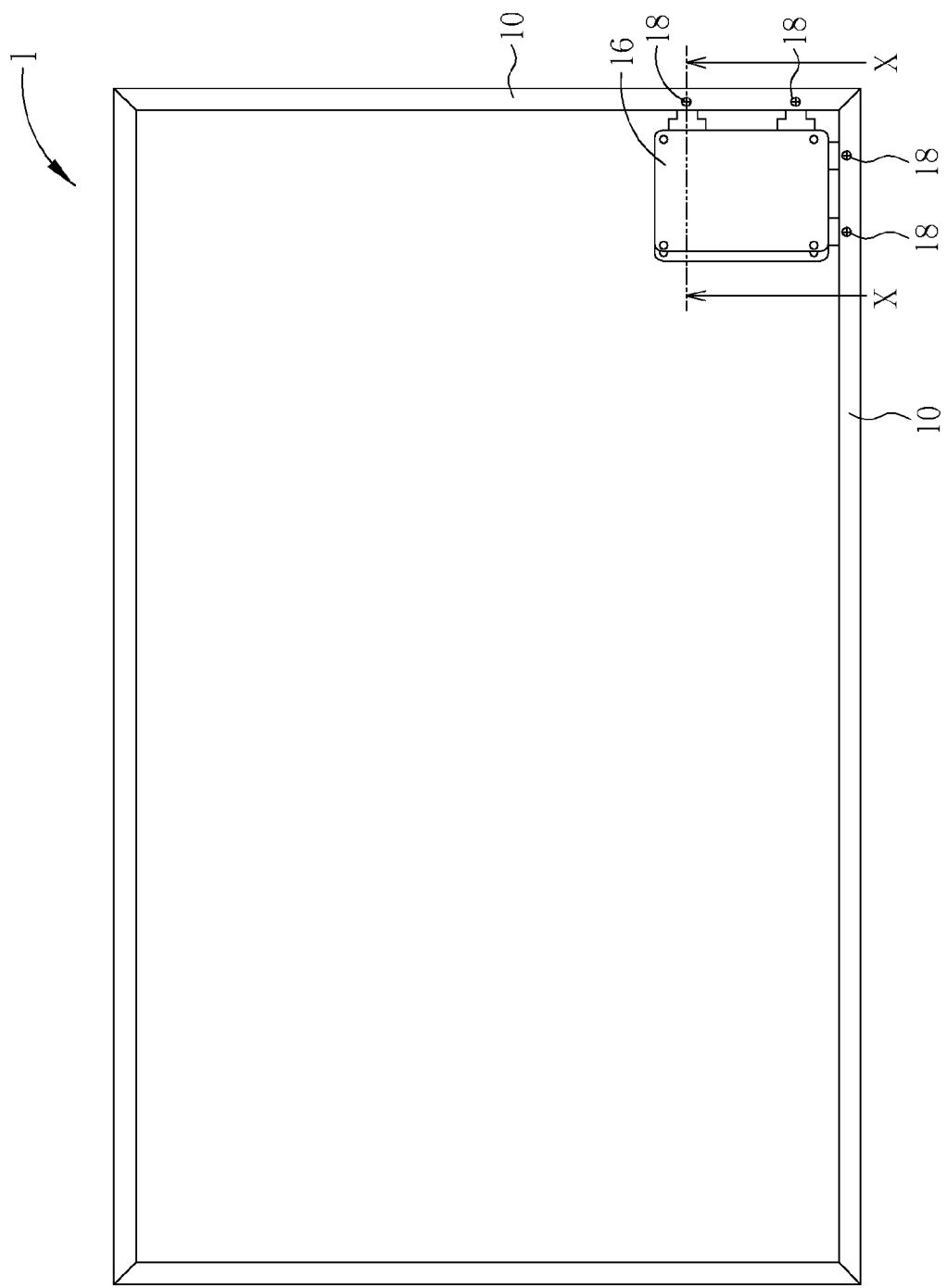
FIG. 1 is a rear view illustrating a solar device of the prior art.
Figure 2:
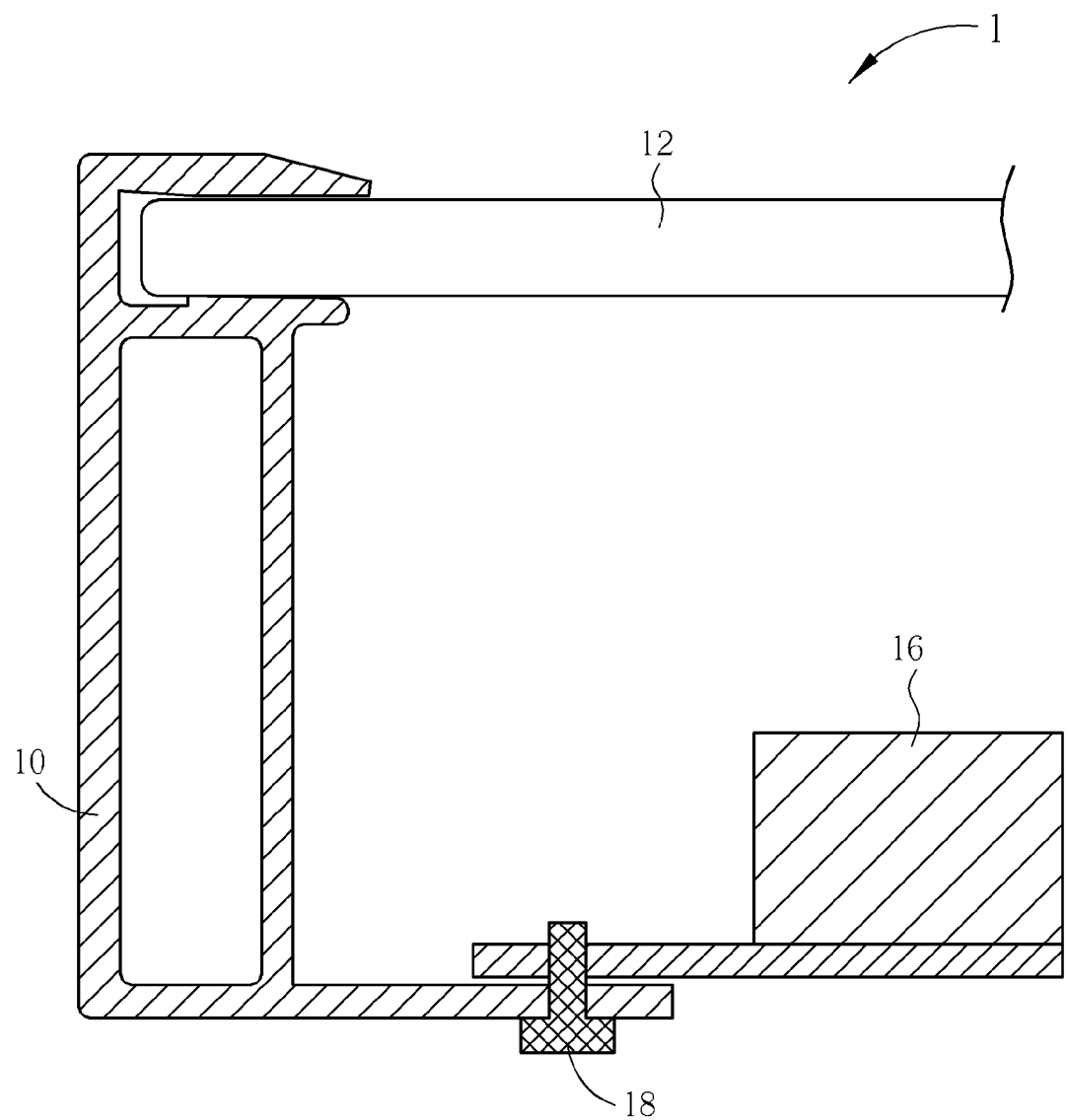
FIG. 2 is a cross-sectional view illustrating the solar device along line X-X shown in FIG. 1.

To assemble the solar device 3, the bodies 3020 of the brackets 302 have to be disposed in the sliding grooves 3000 of two adjacent frames 300. The brackets 302 can be slid with respect to the frames 300 for assembly tolerances of different electronic components 36. Then, the electronic component 36 can be fixed on the extending part 3026 of each bracket 302 by a screw 38, rivet, nail, buckle, glue or other fixing devices. As shown in FIG. 3, two adjacent sides of the electronic component 36 are fixed on two extending parts 3026 of two brackets 302, which are disposed on two adjacent frames 300, respectively. Since the first engaging part 3022 of the bracket 302 is engaged in the first engaging groove 3002 of the frame 300 and the second block part 3024 of the bracket 302 abuts against the first block part 3004 of the frame 300, the invention can increase contact area between the bracket 302 and the frame 300 effectively so as to prevent the bracket 302 from loosing or coming off the frame 300. Furthermore, compared with the solar device 1 of the prior art shown in FIG. 2, the invention can increase the distance between the electronic component 36 and the solar panel 32 effectively. Once the solar device 3 deforms due to external force, the electronic component 36 and the solar panel 32 of the invention will not rub against each other. According to practical stress test, bending resistance and torsion resistance of the frame 300 of the invention are better than those of the conventional frame 10 shown in FIG. 2.

In this embodiment, the electronic component 36 may be, but not limited to, an inverter. The frame assembly 30 may be also used for fixing other electronic components for different products.

Figure 6:
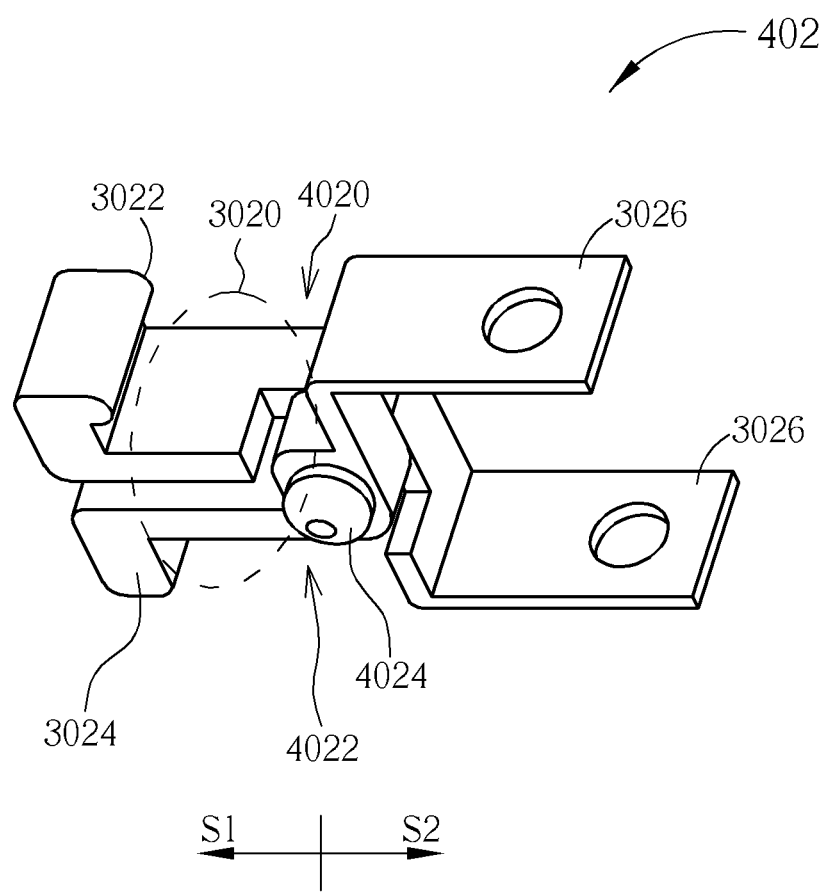
FIG. 6 is an assembly view illustrating a bracket according to another embodiment of the invention.
Figure 7:
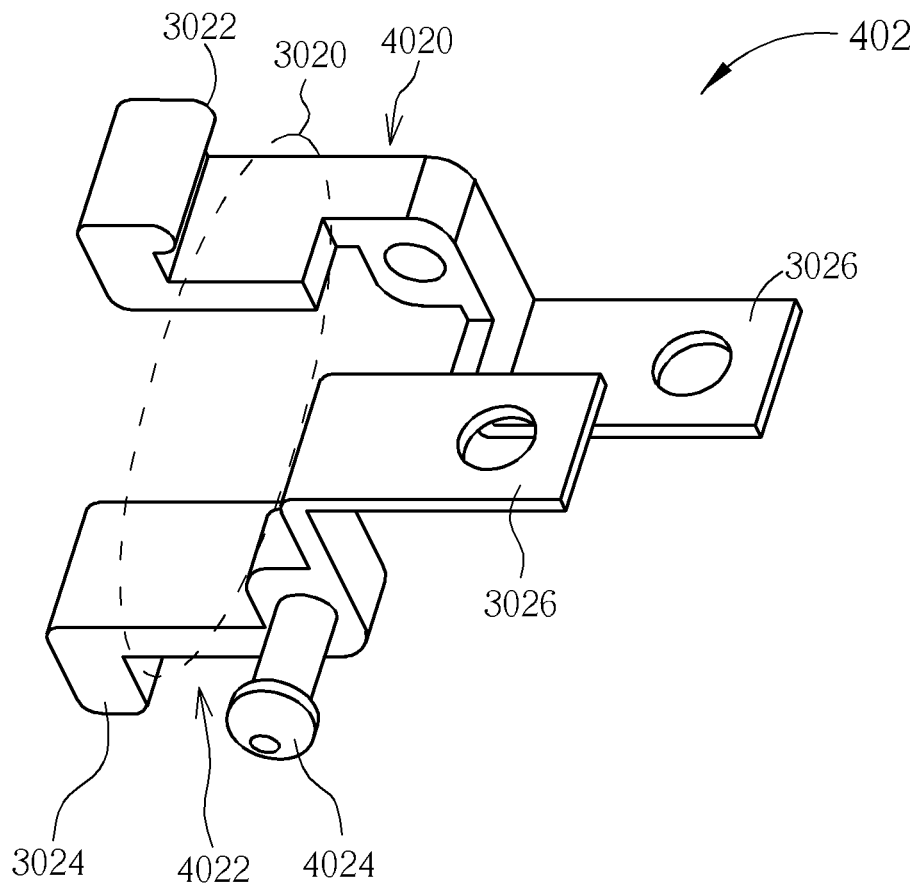
FIG. 7 is an exploded view illustrating the bracket shown in FIG. 6.
Figure 8:
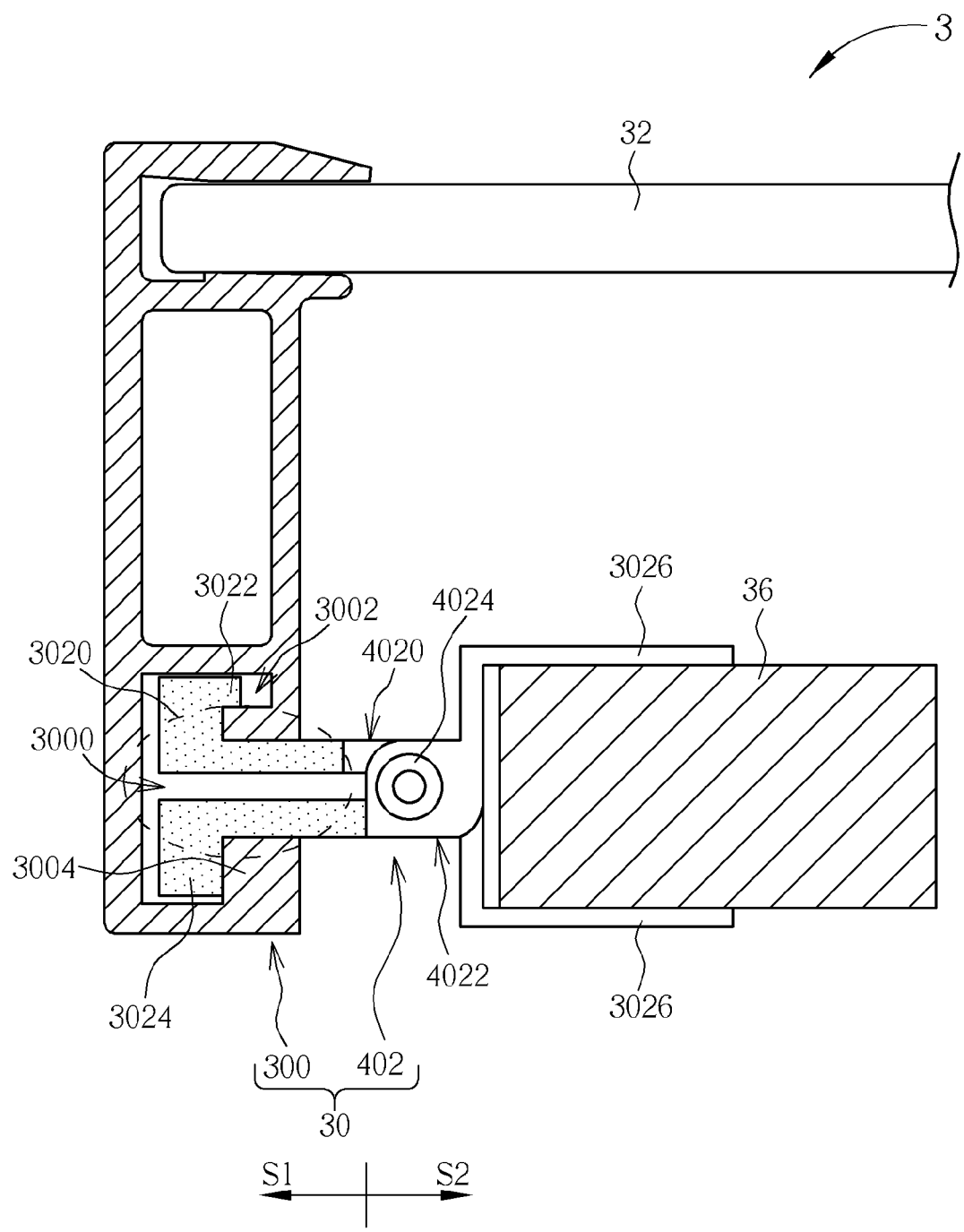
FIG. 8 is a cross-sectional view illustrating the bracket shown in FIG. 4 replaced by the bracket shown in FIG. 6.

Referring to FIGS. 6 to 8, FIG. 6 is an assembly view illustrating a bracket 402 according to another embodiment of the invention, FIG. 7 is an exploded view illustrating the bracket 402 shown in FIG. 6, and FIG. 8 is a cross-sectional view illustrating the bracket 302 shown in FIG. 4 replaced by the bracket 402 shown in FIG. 6. The main difference between the bracket 402 and the aforesaid bracket 302 is that the bracket 402 comprises a first support member 4020, a second support member 4022 and a hinge 4024. As shown in FIGS. 6 to 8, the first support member 4020 and the second support member 4022 are pivotally connected to each other by the hinge 4024 so as to form a scissor shape, and the body 3020 and the extending part 3026 are located at opposite sides of the hinge 4024 respectively. In this embodiment, each of the first support member 4020 and the second support member 4022 has an extending part 3026, the first support member 4020 has a first engaging part 3022, and the second support member 4022 has a second block part 3024. In this embodiment, the first engaging part 3022 and the second block part 3024 are extended from a first side S1 of the body 3020 and the extending parts 3026 are extended from a second side S2 of the body 3020, wherein the first side S1 and the second side S2 are opposite sides of the body 3020. Furthermore, the first engaging part 3022 is an inverse L-shape hook structure, the second block part 3024 is a pillar structure, and the extending part 3026 is a plate structure. It should be noted that the same elements in FIGS. 6 to 8 and FIGS. 4 to 5 are represented by the same numerals, so the repeated explanation will not be depicted herein again.

To assemble the bracket 402 and the frame 300, an operator can press the extending parts 3026 of the first support member 4020 and the second support member 4022 to reduce the distance between the first engaging part 3022 and the second block part 3024. Then, the operator can put the body 3020 into the sliding groove 3000 of the frame 300. After releasing the external force acted on the extending parts 3026, the hinge 4024 will provide a recovery force for driving the first engaging part 3022 to be engaged in the first engaging groove 3002 and driving the second block part 3024 to abut against the first block part 3004 of the frame 300. In general, the hinge is equipped with a torsion spring or other resilient members (not shown). When the hinge twists due to an external force, the torsion spring or resilient member will store elastic energy. When the external force acted on the hinge is removed, the elastic energy stored by the torsion spring or resilient member is released to provide the aforesaid recovery force. In other words, the bracket 402 with scissor-shape can facilitate the assembly. Furthermore, the bracket 302 shown in FIG. 3 can be replaced by the bracket 402 shown in FIGS. 6 to 8 so as to use the bracket 402 to fix the electronic component 36 on the frame 300.

Figure 9:
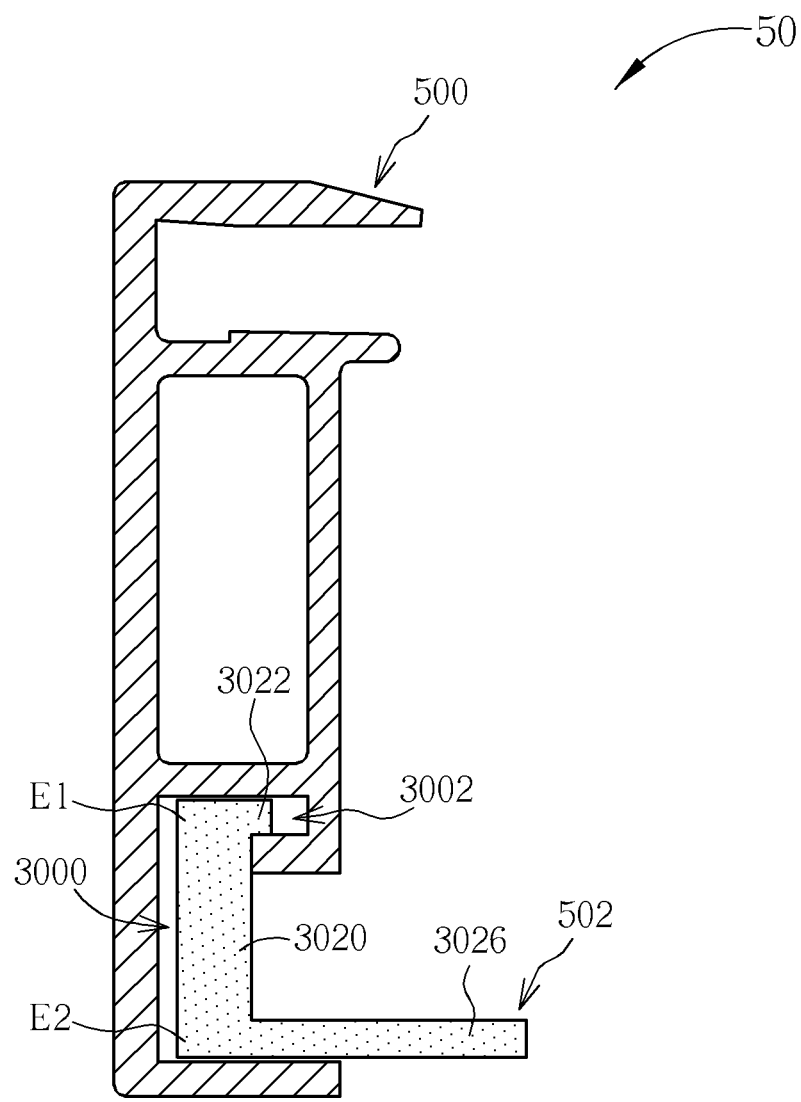
FIG. 9 is a cross-sectional view illustrating a frame assembly according to another embodiment of the invention.
Figure 10:
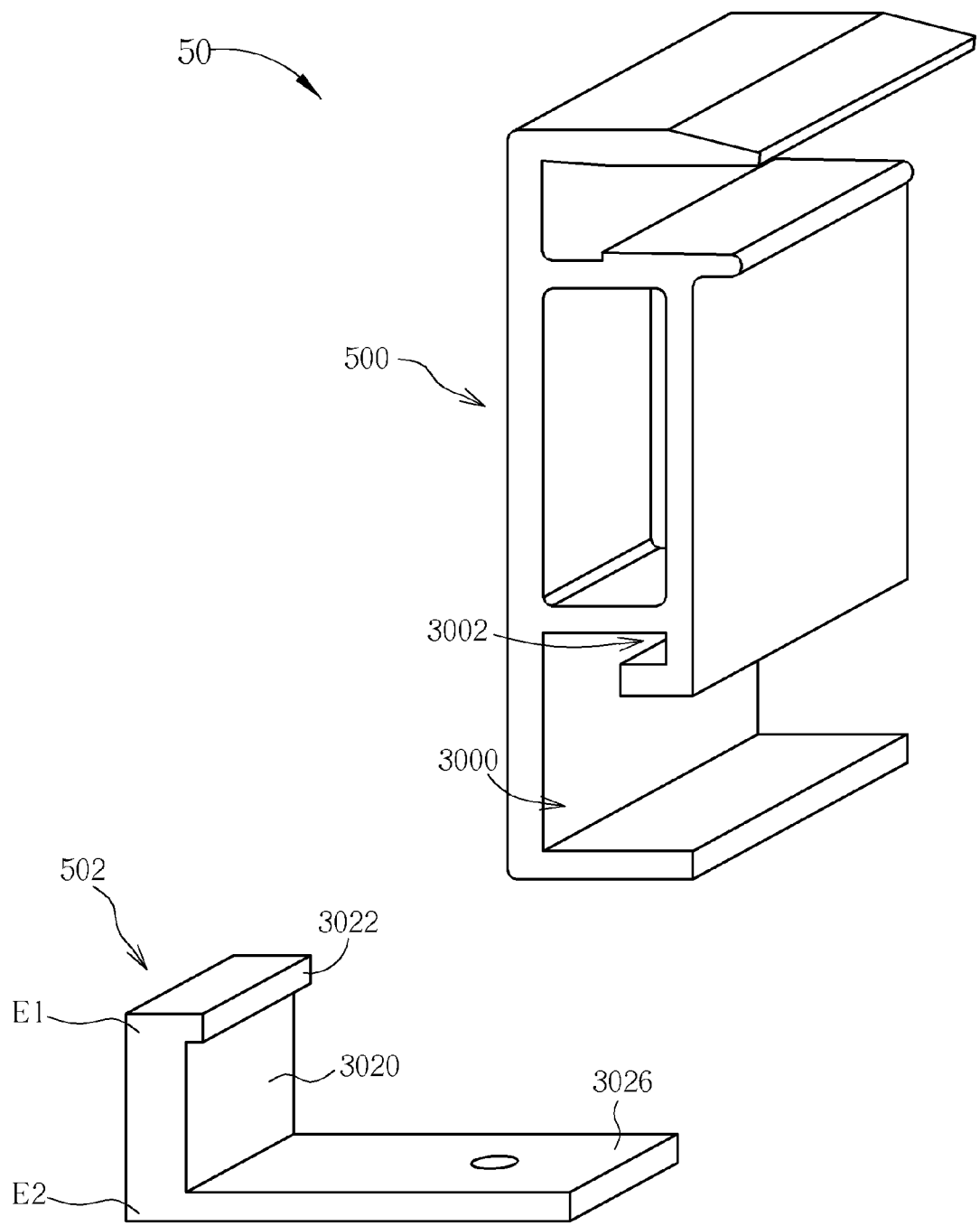
FIG. 10 is an exploded view illustrating the frame assembly shown in FIG. 9.

Referring to FIGS. 9 and 10, FIG. 9 is a cross-sectional view illustrating a frame assembly 50 according to another embodiment of the invention, and FIG. 10 is an exploded view illustrating the frame assembly 50 shown in FIG. 9. The main difference between the frame assembly 50 and the aforesaid frame assembly 30 is that the frame 500 of the frame assembly 50 does not have the aforesaid first block part 3004 and the bracket 502 of the frame assembly 50 does not have the aforesaid second block part 3024. As shown in FIGS. 9 and 10, the bracket 502 is substantially L-shaped. When the body 3020 is disposed in the sliding groove 3000, the first engaging part 3022 is engaged in the first engaging groove 3002 and the extending part 3026 is exposed out of the frame 300. In this embodiment, the first engaging part 3022 is extended from a first end E1 of the body 3020 and the extending part 3026 is extended from a second end E2 of the body 3020. Furthermore, the first engaging part 3022 is a hook structure and the extending part 3026 is a plate structure. It should be noted that the same elements in FIGS. 9 to 10 and FIGS. 4 to 5 are represented by the same numerals, so the repeated explanation will not be depicted herein again. Moreover, the frame 300 and the bracket 302 shown in FIG. 3 can be replaced by the frame 500 and the bracket 502 shown in FIGS. 9 to 10 so as to use the bracket 502 to fix the electronic component 36 on the frame 500.

Figure 11:
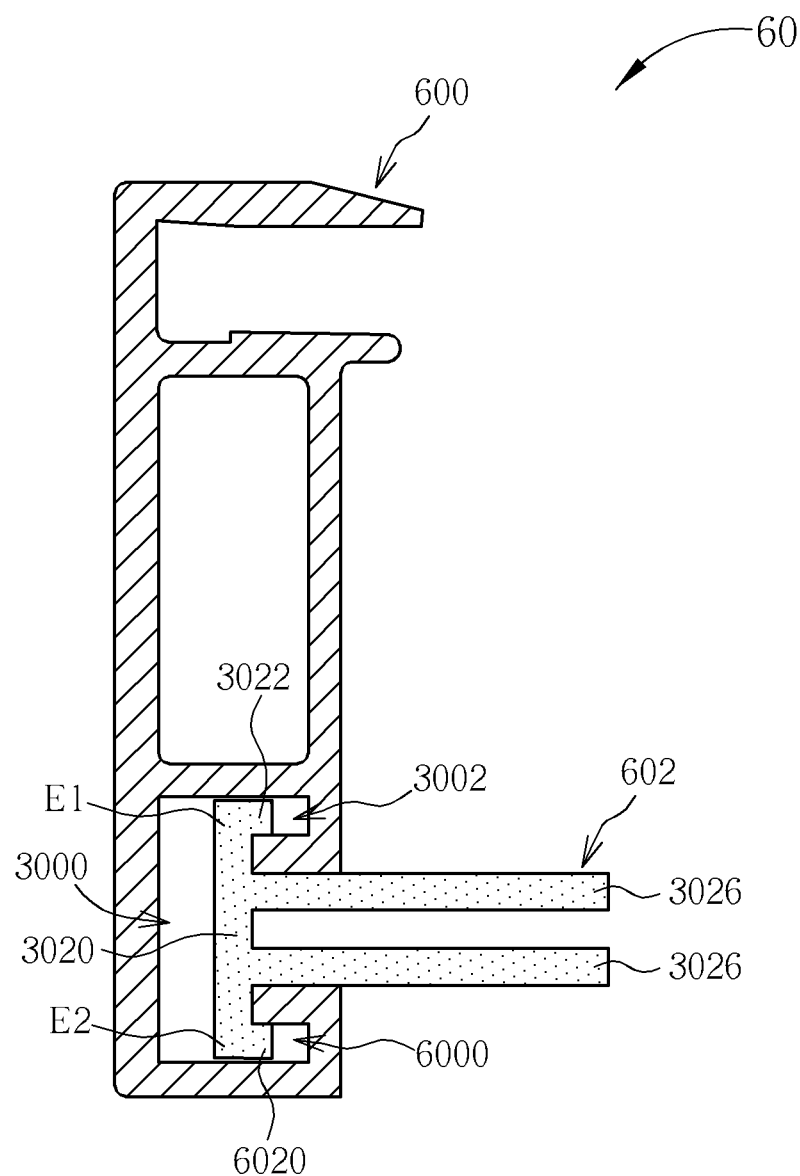
FIG. 11 is a cross-sectional view illustrating a frame assembly according to another embodiment of the invention.
Figure 12:
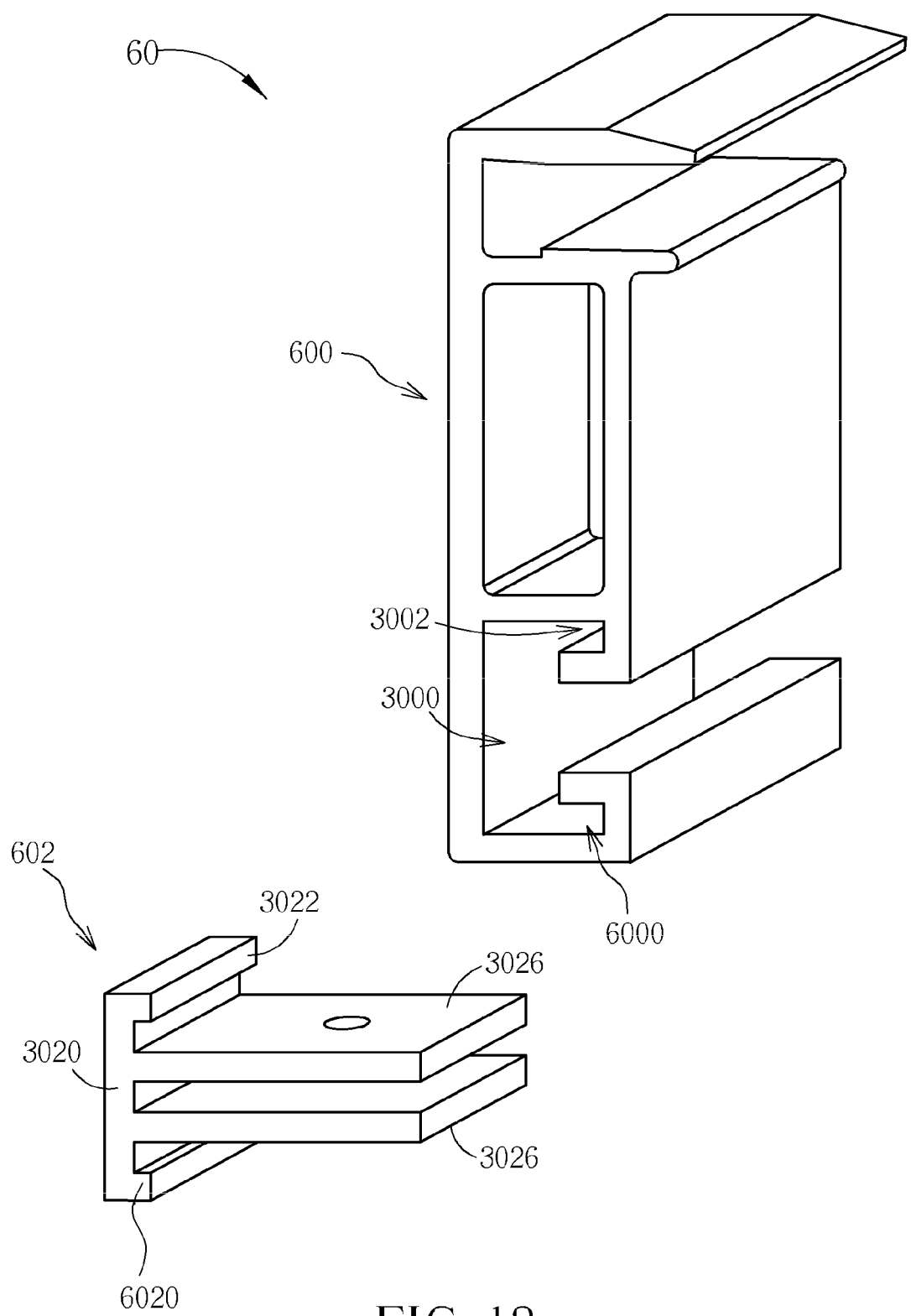
FIG. 12 is an exploded view illustrating the frame assembly shown in FIG. 11.

Referring to FIGS. 11 and 12, FIG. 11 is a cross-sectional view illustrating a frame assembly 60 according to another embodiment of the invention, and FIG. 12 is an exploded view illustrating the frame assembly 60 shown in FIG. 11. The main difference between the frame assembly 60 and the aforesaid frame assembly 30 is that the frame 600 of the frame assembly 60 does not have the aforesaid first block part 3004 but has a second engaging groove 6000, and the bracket 602 of the frame assembly 60 does not have the aforesaid second block part 3024 but has a second engaging part 6020. As shown in FIGS. 11 and 12, the second engaging groove 6000 is formed in the sliding groove 3000 and the second engaging part 6020 is extended from the body 3020. The second engaging groove 6000 and the first engaging groove 3002 are located at opposite sides of the sliding groove 3000. The second engaging part 6020 and the first engaging part 3022 are located at opposite sides of the body 3020. In this embodiment, the first engaging part 3022 is extended from a first end E1 of the body 3020, the second engaging part 6020 is extended from a second end E2 of the body 3020, and the extending part 3026 is extended from a middle portion of the body 3020. Furthermore, the first engaging part 3022 and the second engaging part 6020 are hook structures and the extending part 3026 is a plate structure. When the body 3020 is disposed in the sliding groove 3000, the first engaging part 3022 is engaged in the first engaging groove 3002 and the second engaging part 6020 is engaged in the second engaging groove 6000. Accordingly, the invention can increase contact area between the bracket 602 and the frame 600 effectively so as to prevent the bracket 602 from loosing or coming off the frame 600. It should be noted that the same elements in FIGS. 11 to 12 and FIGS. 4 to 5 are represented by the same numerals, so the repeated explanation will not be depicted herein again. Moreover, the frame 300 and the bracket 302 shown in FIG. 3 can be replaced by the frame 600 and the bracket 602 shown in FIGS. 11 to 12 so as to use the bracket 602 to fix the electronic component 36 on the frame 600.

Compared with the prior art, to assemble the solar device of the invention, the body of the bracket has to be disposed in the sliding groove of the frame. The bracket can be slid with respect to the frame for assembly tolerances of different electronic components so as to fix the electronic component on the extending part of the bracket. Since the first engaging part of the bracket is engaged in the first engaging groove of the frame, the invention can increase contact area between the bracket and the frame effectively so as to prevent the bracket from loosing or coming off the frame. Furthermore, the pair of second engaging groove and second engaging part or the pair of first block part and second block part can be disposed on the frame and the bracket so as to further increase contact area between the bracket and the frame. Moreover, the bracket can be formed as scissor-shape so as to facilitate the assembly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frame assembly comprising:
    a frame having a sliding groove and a first engaging groove, the sliding groove being formed at one side of the frame, the first engaging groove being formed in the sliding groove, an opening direction of the sliding groove being parallel and opposite to an opening direction of the first engaging groove;
    a bracket having a body, a first engaging part and an extending part, the first engaging part and the extending part being extended from the body, the bracket comprising a first support member, a second support member and a hinge, the first support member and the second support member being pivotally connected to each other by the hinge so as to form a scissor shape, the body and the extending part being located at opposite sides of the hinge respectively;
    wherein when the body is disposed in the sliding groove, the first engaging part is engaged in the first engaging groove and the extending part is exposed out of the frame.

2. The frame assembly of claim 1, wherein the frame further has a second engaging groove formed in the sliding groove, the second engaging groove and the first engaging groove are located at opposite sides of the sliding groove respectively, the bracket further has a second engaging part extended from the body, the second engaging part and the first engaging part are located at opposite sides of the body respectively, when the body is disposed in the sliding groove, the first engaging part is engaged in the first engaging groove and the second engaging part is engaged in the second engaging groove.

3. The frame assembly of claim 1, wherein the frame further has a first block part formed in the sliding groove, the first block part and the first engaging groove are located at opposite sides of the sliding groove respectively, the bracket further has a second block part extended from the body, the second block part and the first engaging part are located at opposite sides of the body respectively, when the body is disposed in the sliding groove, the first engaging part is engaged in the first engaging groove and the second block part abuts against the first block part.

4. A solar device comprising:
    a frame assembly comprising:
        two frames connected to each other, each of the frames having a sliding groove and a first engaging groove, the sliding groove being formed at one side of the frame, the first engaging groove being formed in the sliding groove; and
        two brackets, each of the brackets having a body, a first engaging part and an extending part, the first engaging part and the extending part being extended from the body, wherein when the body of each of the brackets is disposed in the sliding groove of one of the frames, the first engaging part is engaged in the first engaging groove and the extending part is exposed out of the frame;
    a solar panel disposed in the frames; and
    an electronic component, two adjacent sides of the electronic component being fixed on the two extending parts of the two brackets respectively;
    wherein the frame is configured to hold the solar panel with a holding groove and an opening direction of the sliding groove is parallel and identical to an opening direction of the holding groove.

5. The solar device of claim 4, wherein each of the frames further has a second engaging groove formed in the sliding groove, the second engaging groove and the first engaging groove are located at opposite sides of the sliding groove respectively, each of the brackets further has a second engaging part extended from the body, the second engaging part and the first engaging part are located at opposite sides of the body respectively, when the body is disposed in the sliding groove, the first engaging part is engaged in the first engaging groove and the second engaging part is engaged in the second engaging groove.

6. The solar device of claim 4, wherein each of the frames further has a first block part formed in the sliding groove, the first block part and the first engaging groove are located at opposite sides of the sliding groove respectively, each of the brackets further has a second block part extended from the body, the second block part and the first engaging part are located at opposite sides of the body respectively, when the body is disposed in the sliding groove, the first engaging part is engaged in the first engaging groove and the second block part abuts against the first block part.

7. The solar device of claim 4, wherein each of the brackets comprises a first support member, a second support member and a hinge, the first support member and the second support member are pivotally connected to each other by the hinge so as to form a scissor shape, the body and the extending part are located at opposite sides of the hinge respectively.

8. The solar device of claim 7, wherein the electronic component is an inverter.

9. The solar device of claim 5, wherein each of the brackets comprises a first support member, a second support member and a hinge, the first support member and the second support member are pivotally connected to each other by the hinge so as to form a scissor shape, the body and the extending part are located at opposite sides of the hinge respectively.

10. The solar device of claim 9, wherein the electronic component is an inverter.

11. The solar device of claim 6, wherein each of the brackets comprises a first support member, a second support member and a hinge, the first support member and the second support member are pivotally connected to each other by the hinge so as to form a scissor shape, the body and the extending part are located at opposite sides of the hinge respectively.

12. The solar device of claim 11, wherein the electronic component is an inverter.

13. The frame assembly of claim 1, wherein the frame is configured to hold a solar panel with a holding groove and the opening direction of the sliding groove is parallel and identical to an opening direction of the holding groove.

* * * * *